United States Patent [19]

Hedstrom et al.

[11] Patent Number: 5,239,273

[45] Date of Patent: Aug. 24, 1993

[54] DIGITAL DEMODUALTOR USING SIGNAL PROCESSOR TO EVALUATE PERIOD MEASUREMENTS

[75] Inventors: Mark D. Hedstrom, Naples; Charles R. Crego, Fort Myers; Robert B. Porter, Bonita Springs, all of Fla.

[73] Assignee: Numa Technologies, Inc., Naples, Fla.

[21] Appl. No.: 900,367

[22] Filed: Jun. 18, 1992

Related U.S. Application Data

[63] Continuation-in-part of Ser. No. 794,150, Nov. 20, 1991, Pat. No. 5,159,281.

[51] Int. Cl.$^5$ .............................................. H03D 3/00
[52] U.S. Cl. ................................. 329/312; 329/321; 329/341; 375/80; 375/95
[58] Field of Search ............... 329/300, 301, 303–305, 329/310–314, 321, 327, 329, 335, 340–343, 345; 455/214, 337; 375/80, 82, 94–96

[56] References Cited

U.S. PATENT DOCUMENTS

| | | | |
|---|---|---|---|
| 4,570,126 | 2/1986 | Demmer et al. | 329/107 |
| 4,596,022 | 6/1986 | Stoner | 329/303 |
| 4,669,095 | 5/1987 | Hall | 375/90 |
| 4,707,666 | 11/1987 | Pfeifer et al. | 329/343 |
| 4,992,748 | 2/1991 | Gard | 329/321 |

OTHER PUBLICATIONS

C. R. Cahn et al., "Digital Phase Sampling for Microcomputer Implementation of Carrier Acquisition and Coherent Tracking", IEEE Transactions on Communications, vol. Com-28, No. 8, Aug., 1980, pp. 1190–1196.
Thomas, D. M., "Heath's Digital FM Tuner," *Radio–Electronics*, May 1973, pp. 42–45, 50, 98.
Krauss, H. L., Bostian, C. W., and Raab, F. H., *Solid State Radio Engineering*, pub. by John Wiley & Sons, 1980, pp. 254–255, 315–317.
R. J. Higgins, *Digital Signal Processing in VLSI*, publ. by Prentice-Hall, 1990, (Fig. 5.6) and p. 268.
Bendat, J. S. and Piersol, A. G., *Random Data: Analysis and Measurement Procedures*, 2nd Edition, publ. by Wiley Interscience, 1986, p. 340.
Oppenheim, A. V., and Schafer, R. W., *Digital Signal Processing*, publ. by Prentice-Hall, 1975, pp. 242, 408–409.

*Primary Examiner*—Siegfried H. Grimm
*Attorney, Agent, or Firm*—Weingarten, Schurgin, Gagnebin & Hayes

[57] ABSTRACT

A digital demodulator provides efficient demodulation of frequency modulated, pulse-width modulated, and other temporally modulated signals. Without employing an analog-to-digital converter, modulating signal information is extracted from a modulated signal as numerical information. For frequency demodulation, a high gain stage is applied to an incoming FM signal to produce a corresponding sequence of square waves. The period between zero-crossings of the square waves is accurately measured to within one clock pulse using a high-speed clock and at least one counter. Period information is then provided to a signal processor that serves to convert the sequence of period measurement values into a demodulated signal with a high signal-to-noise ratio. In another embodiment, a so-termed "reciprocal fit count scaling" method is employed to provide an exact analytic solution to count scaling performed in the signal processor, and thus provide the most accurate and optimal results attainable from a system of this type. Such improved performance provides an estimated signal with significantly high scaling accuracy, lower total harmonic distortion, and an excellent signal-to-noise ratio.

14 Claims, 11 Drawing Sheets

DIGITAL DEMODUALTOR USING SIGNAL PROCESSOR TO EVALUATE PERIOD MEASUREMENTS

CROSS-REFERENCE TO RELATED APPLICATION

This application is a continuation-in-part of application Ser. No. 07/794,150, filed Nov. 20, 1991 and now U.S. Pat. No. 5,159,281.

FIELD OF THE INVENTION

This invention relates to a method and apparatus for detecting and demodulating signals with temporally modulated features, and particularly to frequency modulated signals.

BACKGROUND OF THE INVENTION

In Frequency Modulation (FM), a sinusoidal carrier signal of constant amplitude and frequency is modulated by an input signal of a lower frequency and of varying amplitude. FM thereby produces an output signal that is constant in amplitude, varying in frequency in accordance with the input signal, and within a specified frequency range called the deviation bandwidth. In particular, the instantaneous amplitude of the input signal is linearly transformed into a change $d\omega$ in the instantaneous frequency $\omega(t)$ of the carrier frequency $\omega_c$. To recover the input modulating signal from the output modulation signal, frequency demodulation must be performed using an FM demodulator.

FM demodulators are well known, and consist of devices such as ratio detectors, Foster Seeley discriminators, phase-locked loop detectors, pulse-counting detectors, and quadrature or coincidence detectors. All of these demodulators—whether implemented as analog or digital apparatus—pass data to post-processing stages, and ultimately to an output amplifier.

For example, the Heathkit AJ-1510 Digital FM Tuner employs a digital discrimination technique for demodulating a frequency modulated signal. The discriminator is of the pulse position modulation type, is inductorless and diodeless, and contains two integrated circuits: a retriggerable monostable multivibrator, and an operational amplifier. An input signal at the retriggerable monostable multivibrator causes it to change states for a fixed period of time, as determined by an RC network to provide a sequence of pulses of constant width and amplitude that are generated at about one-half of the IF rate. Each pulse represents a zero-crossing event. Signal information is represented as deviations in the frequency of the zero-crossing pulses from a constant IF frequency.

In a pulse integration type of FM demodulator, the frequency modulated signals typically are amplified and "hard-limited" to produce square waves which have zero-crossings spaced in the same manner as the zero-crossings of the FM signals. The square waves are then converted into a sequence of constant width and amplitude pulses, one pulse for each zero-crossing of the modulated input signal. Each pulse is integrated (or filtered) and subsequently differentiated to reproduce the modulating input signal information.

There are pulse integration demodulators that employ a single one-shot multivibrator that is triggered at each zero-crossing. However, recovery time difficulties are encountered during high frequency operation because the internal delay of the multivibrator approaches the period of the high frequency signals as the operating frequency is increased.

In another form of pulse integration demodulator, a source of frequency modulated signals is coupled to a coincidence detector by a first and second signal path. The first and second signal paths have unequal signal delay characteristics, so that the coincidence detector provides an output signal that includes a series of constant width pulses, wherein pulse width is determined by a difference in signal delay between the first and second signal paths. A low pass filter is coupled to the coincidence detector to recover the signal modulation represented by the series of constant width pulses. However, this form of pulse integrator exhibits operating disadvantages due to non-linearity of the integrating network which impairs its ability to perform sufficiently precise integration on the applied signal pulse train.

SUMMARY OF THE INVENTION

An apparatus and method is provided for demodulating a frequency modulated (FM), pulse-width modulated (PWM), or other temporally modulated signal. Without employing an analog-to-digital converter, modulating signal information is extracted from a modulated signal as numerical information. To demodulate an FM signal, for example, a high gain stage is applied to an incoming FM signal to produce a corresponding sequence of square waves. The period between zero-crossings of the square waves is precisely measured and represented numerically using a high-speed clock and at least one counter. Numerical period information is then provided to a signal processor that serves to convert the sequence of period measurement values into a demodulated signal with a high signal-to-noise ratio.

After a received FM signal is heterodyned with a local oscillator signal, the resulting FM intermediate frequency (IF) signal is "hard-limited" to yield a hard-limited FM IF signal that substantially resembles a sequence of square waves which are provided to a sign detector for detecting zero-crossings. In preferred embodiments, the frequency of the local oscillator signal is chosen so as to yield relatively low FM IF frequencies. The sign detector is coupled to a pair of gating circuits, each gating circuit being coupled to a respective pulse counter, and to a clock. The gating circuits are alternately enabled in accordance with the instantaneous sign of the hard-limited FM IF signal. When enabled, each sample gating circuit provides a sequence of clock pulses from the clock to a respective pulse counter. Each pulse counter stores a respective count value that represents the period between zero-crossings of the hard-limited FM IF signal. The foregoing elements together constitute a digital discriminator. In one embodiment, a numerical processor, connected to the counters of the digital discriminator, is responsive to the changing respective count values, and reconstructs in real time the original modulating input signal. The numerical processor performs calculations upon the signal including: weighting, scaling, impulse response filtering, windowing, and interpolation/decimation. Increasing the rate of the clock yields improved resolution in the reconstructed modulating signal, up to the maximum resolution of the counting circuit. Subsequent digital filtering provides a low pass filter function that effectively eliminates high frequency components.

The digital demodulator of the invention exploits the linearity of digital processing to provide excellent performance. Since the demodulation method of the invention requires only low level signals and introduces minimal noise, lower total noise levels result, and a high signal-to-noise ratio is achieved. Consequently, the demodulator of the invention can more easily receive weak signals, and suffers fewer "drop-outs", a problem that is now common in fringe reception areas, as well as in dense urban centers. Also, the invention reduces the need for amplification of a received signal, thereby increasing reliability and reception quality. Therefore, at a given level of transmission power, greater transmission range is possible. One potential product area is in satellite broadcast applications; a smaller antenna could be used when the method of the invention is employed within the receiver. Further, the invention can be practiced using currently available, relatively inexpensive components. Also, since it is consistent and cooperative with existing modulation standards and transmission formats, the invention actually increases the value of the currently installed base of transmission equipment. Although the invention provides benefits when included in 2-way radio, cellular telephone, and FM broadcast applications, the invention is not limited to a specific frequency band, or to a particular application.

The demodulation method and apparatus of the invention introduces negligible noise, as contrasted with the levels of noise added by conventional FM demodulation circuitry.

In another embodiment of the invention, a so-termed "reciprocal fit count scaling" method is employed that provides better performance than a linear count scaling method, and improved performance with respect to a least-squares-fit, nonlinear count scaling method. Such improved performance provides an estimated signal with significantly higher scaling accuracy, lower total harmonic distortion, and an excellent signal-to-noise ratio. In fact, the reciprocal count scaling method provides an exact analytic solution, and guarantees the most accurate and optimal results attainable from a system of this type.

DESCRIPTION OF THE DRAWING

The invention will be more fully understood from the following detailed description, in conjunction with the accompanying figures, in which.

DESCRIPTION OF THE PREFERRED EMBODIMENT

Figure 1:
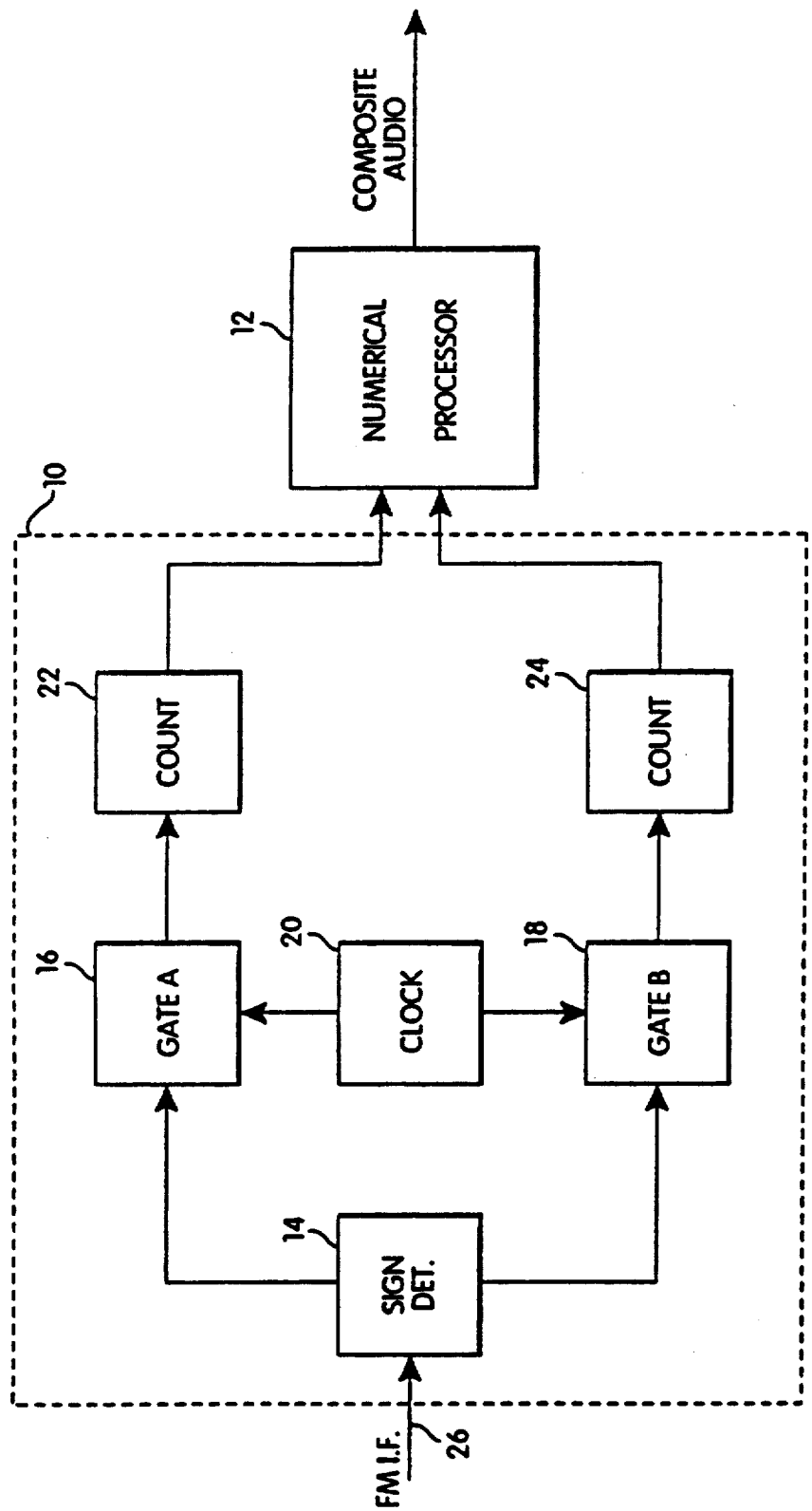
FIG. 1 is a block diagram of a digital discriminator cooperative with a numerical processor.

With reference to FIG. 1, a digital discriminator 10 is shown in cooperation with a numerical processor 12. The digital discriminator 10 utilizes zero-crossing detection and period measurement of a "hard-limited" FM IF signal to recover an associated modulating signal by exploiting the fact that the instantaneous frequency of an FM IF signal is inversely proportional to the instantaneous period of the associated modulating signal.

Discrimination is accomplished by applying a "hard-limited" FM IF signal to the sign detector 14. To form a hard-limited signal, an input signal is amplified and then clipped to provide what is essentially a square wave. The sign detector 14 ascertains the instantaneous polarity along each corresponding half-cycle of the FM IF signal, thereby defining the moment of each zero-crossing. The period between zero-crossings is determined by providing information regarding the moment of each zero-crossing to gating circuits 16 and 18. The gating circuits 16 and 18 are alternately enabled or disabled in accordance with the instantaneous sign of the hard-limited FM IF signal provided by the sign detector 14. When enabled, each sample gating circuit provides a sequence of clock pulses from the clock 20 to a respective pulse counter 22 or 24 until the other sampling gate circuit 18 or 16 is enabled. A short sequence Of Clock pulses between zero-crossings corresponds to a large modulating signal amplitude, while a long sequence of system clock pulses corresponds to a small modulating signal amplitude. Each sequence of clock pulses is integrated by a respective counter 22 or 24 to provide a count value that represents the period of a half cycle of the FM IF signal. The counters 22 and 24 alternately provide count values to the numerical processor 12, which can be a commercially available digital signal processor, such as the 2101 Digital Signal Processor by Analog Devices.

Figure 1A:
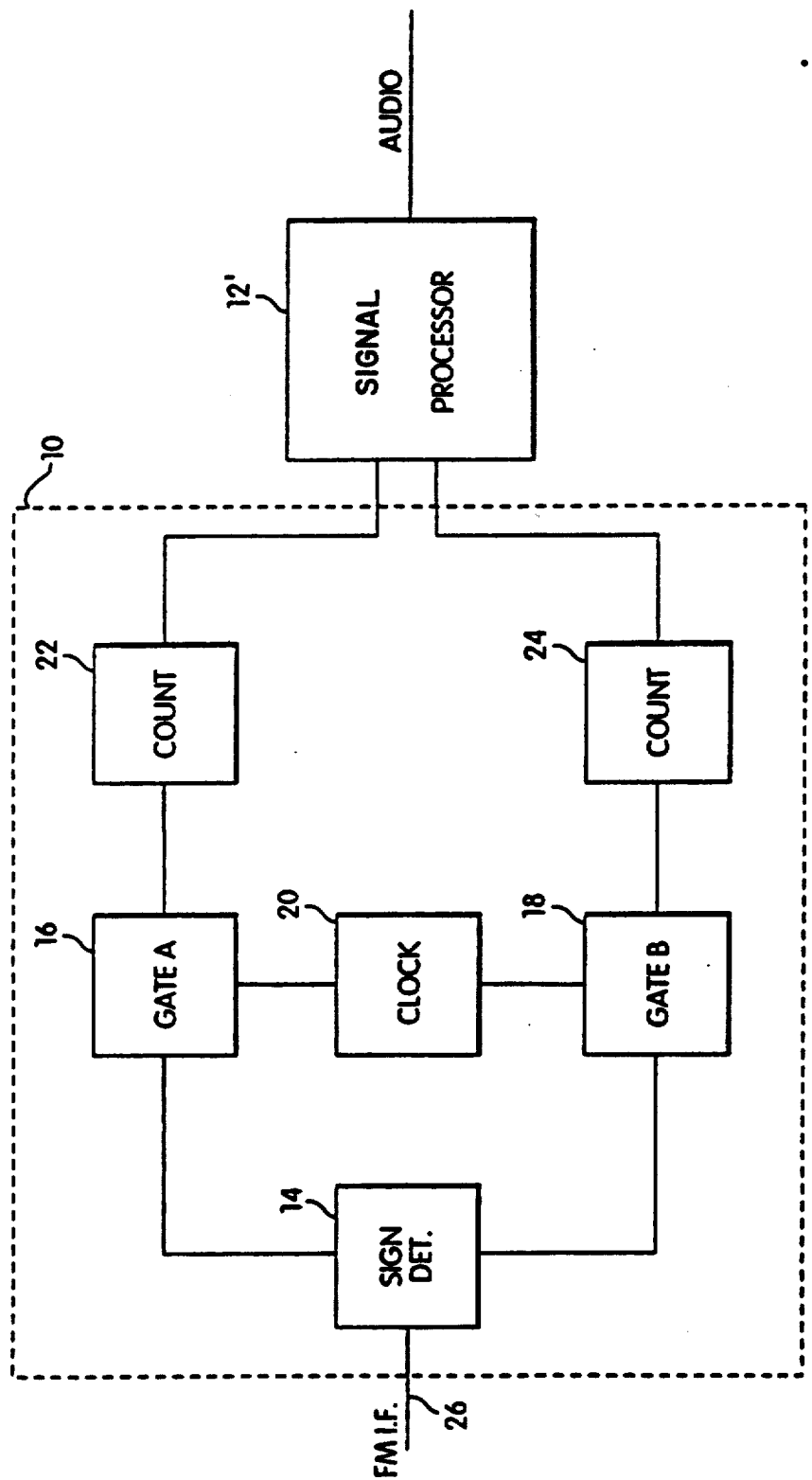
FIG. 1A is a block diagram of a digital discriminator cooperative with a signal processor.

In an alternate embodiment, shown in FIG. 1A, the counters 22 and 24 alternately provide count values to a signal processor 25 that can perform at least digital-to-analog conversion. The output of the signal processor is a usable demodulated signal.

Figure 2:
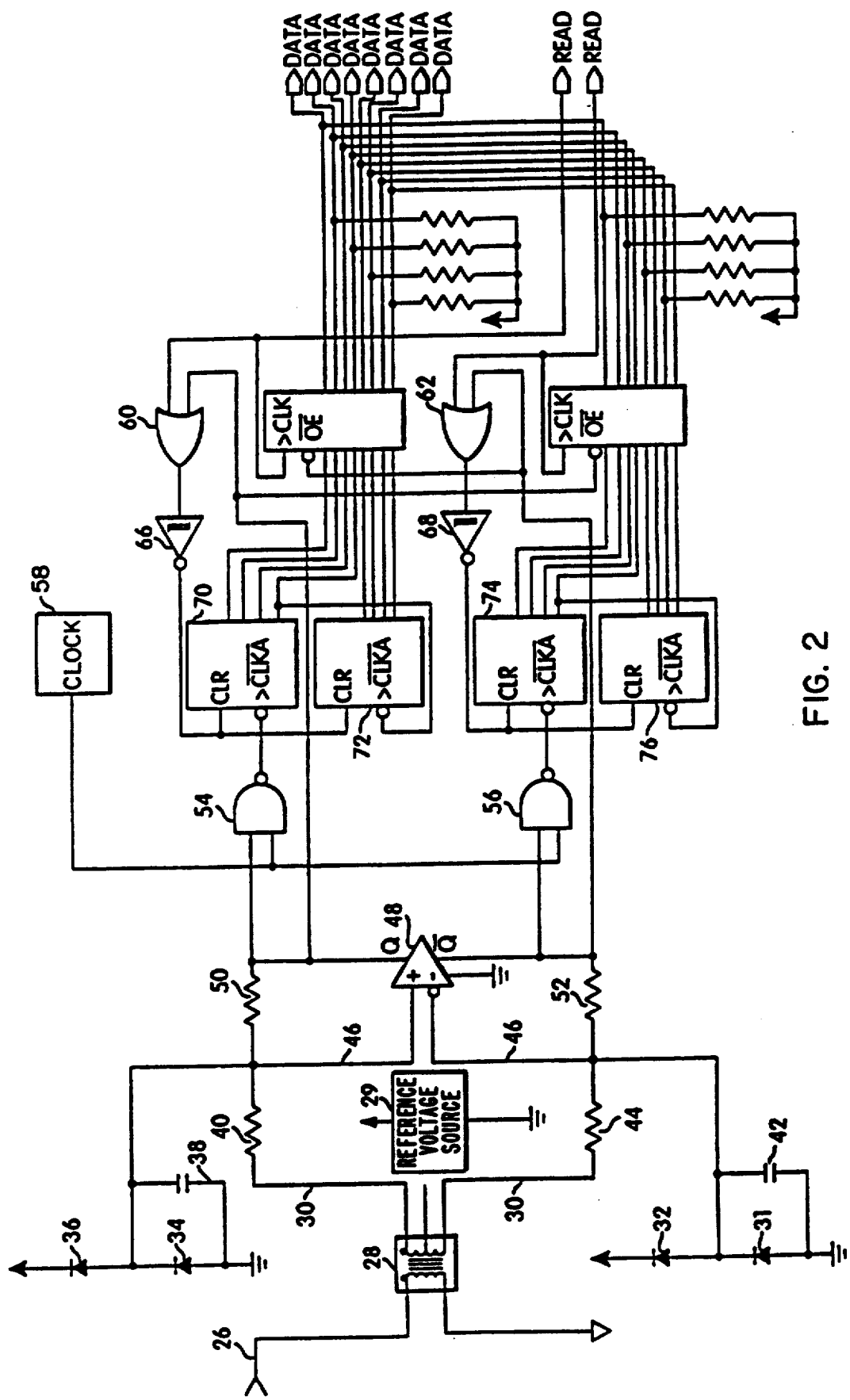
FIG. 2 is a schematic diagram of the digital discriminator of FIG. 1.

Referring to FIG. 2, a preferred embodiment of the discriminator 10 of FIG. 1 will now be discussed. A hard limited IF FM signal 26 is applied to the primary winding of transformer 28. This transformer stage provides the required impedance matching to the preceding circuit stages and dc decoupling or blocking to the succeeding stage. The center tap of the secondary of transformer 28 is biased by a reference voltage source 29 at the mid-point of the circuit supply voltage to provide a DC reference voltage. The reference voltage source 29 establishes a voltage level about which the oppositely phased voltages developed across the secondary winding of transformer 28 are symmetrical. These oppositely phased voltages represent zero-axis crossings corresponding to the zero-crossings of the modulated IF FM signal. The signal 30 from the transformer 28 is limited in amplitude by small signal diodes 31–36, and is low pass filtered by resistor and capacitor pairs 38, 40 and 42, 44. This limited and filtered signal 46 is applied in a differential manner to the inverting and non-inverting inputs of comparator 48. Switching hysteresis is provided by applying positive feedback from both Q and /Q outputs via resistors 50 and 52, respectively. The comparator outputs Q and /Q produce gate pulses proportional in width to the zero crossings of the FM IF signal. This gate pulse is applied to one of the inputs on each of the NAND gates 54 and 56. Clock 58 provides a source of high frequency clock pulses which is similarly applied to the other inputs of NAND gates 54 and 56. The resultant output of NAND gates 54 and 56 contain multiple sample clock periods wherein the number of sample clock periods are directly proportional to the width of the gating pulse. Comparator 48 outputs Q and /Q are applied to one input of OR gates 60 and 62 to be combinatorially or'd with the /READ signal to provide a /CLR=/Q */READ function which is subsequently fed to inverter gates 66 and 68 for signal inversion and is then applied to the clear inputs of counters 70 and 72, and counters 74 and 76. The counter clear operation occurs during the READ operation for each counter 70–76 on each alternating half cycle of the gate pulses produced at Q and /Q of comparator 48. The UP counters 70–76 count clock transitions applied to the clock input of the first 4-bit counter stage during a positive or high level at either Q or /Q of comparator 48. Each counter 70–76 alternately counts during each half cycle of the FM signal. Each counter is then cleared during the opposite counters "UP" count period. The count information of each counter is latched into the corresponding 8-bit latch on the rising edge of the alternate counters "gate pulse" Q and /Q. This allows the data to be latched before the information is cleared from the counter during the next valid clear signal. Period information in the form of "count values" are subsequently read from each counter on an alternating basis. Data is available to the data bus during a valid /READ signal from the numerical processor.

The numerical processor 12 of FIG. 1 will now be discussed. The advent of digital signal processing (DSP) chips has allowed the development of real-time DSP applications. Prior to DSP-specific chipsets, the operating speeds of conventional Von Neumann processors prohibited their application to real-time digital signal processing. Current DSP microprocessors are typically based on the "Harvard Architecture". The primary difference between the Harvard-type and the Von Neumann-type architectures is the separate data and instruction buses within the Harvard Architecture chip. This bus scheme allows for simultaneous data and program memory fetches.

Another important innovation in DSP chip technology is the so-termed single cycle instruction set. This capability allows each instruction in a DSP chip to be executed in one clock cycle, brought about by implementing the instruction sets of DSP chips as part of the architecture itself, rather than in microcode, as is common in most non-DSP processors.

To further enhance the operating speed of DSP processors, chip manufacturers added parallelism and pipelining functions to the Harvard Architecture devices. Parallelism refers to the capability of a signal processing device to carry out more than one operation at a time. For example, data may be read from the parallel data bus via a parallel input/output port, while the address of the incoming data is being placed into the shifter stack and the next program instruction is concurrently being fetched from the instruction stack. Conversely, it is also possible to transmit previous results from the serial port of the processor to the DAC during data processing steps. An excellent "pseudocode" example of parallelism in a DSP processor is as follows: fetch an instruction; compute the next instruction's address; perform one or two data transfers; update one or two data address pointers; and perform a computation, all within a single cycle.

"Pipelining" refers to a process whereby the result(s) of a first operation within the processor are immediately available as input(s) to a second operation, without the added requirement that data be moved via a program step. For example, the result of a shifter operation may be directly used as an input to a multiplier accumulator section. In this context, pipelining is considered only one level deep. Future processors will most likely allow for several levels of pipelining. These innovations have enabled DSP chips to process large quantities of data much faster than previously thought possible, making real-time data-processing a reality.

According to the invention, further computational efficiencies are obtained by choosing a computationally optimal order for executing mathematically equivalent statements. Although the order of operations typically does not matter in arithmetic, it does influence computational speed considerably. For example, (Add, then multiply) = (Multiply, then add)
$(A + B) * (C + D) = AC + AD + BC + BD$ Both sides are identical mathematically, but the left half takes two "adds" and one "multiply", while the right half takes three "adds" and four "multiplies", providing a significant difference in computational overhead.

The instructions executed by the numerical processor 12 exploit all of the above-mentioned efficiencies to perform computations in an extremely efficient manner, thereby providing extra time for performing additional instructions. Furthermore, any new means for enhancing performance of the numerical processor 12 that may become available in the future will serve to enhance the performance of the apparatus and method of the invention. Moreover, the apparatus and method of the invention is not limited to any particular numerical processor, or any DSP in particular.

The numerical processor 12 of FIG. 1 receives zero-crossing interval information from the counters 22, 24, and performs a differentiation process, to be described below, on successive interval values to recover modulating amplitude information. Since there are two zero-crossing events in a sinusoidal wave, an instantaneous frequency value F(t) can be recovered by taking the reciprocal of twice the period T(t) between successive zero-crossing events. Thus, $$F(t) = 1/(2*T(t)). \quad (1)$$

The zero-crossing periods T(t) are given (within the limits of quantization) by:

$$T(t) = N(t)*T_{clock}, \quad (2)$$

where "N(t)" is the number of "counts", i.e., clock pulses, within a given zero-crossing period, and "$T_{clock}$" is the period of the clock, i.e., the time between clock pulses. Quantization errors e(t) exist due to ambiguities in the pulse counting process. During a clock period, an actual zero-crossing could take place at any point in time from:

$$T=(N-0.5)*T_{clock} \text{ to } T=(N+0.5)*T_{clock},$$

giving an uncertainty e(t) in the knowledge of the exact moment of a zero-crossing of:

$$e(t)=\pm 0.5*T_{clock}. \qquad (3)$$

The accuracy of the digitization process is therefore dependent upon the frequency of the clock. As the clock speed "$F_{clock}$" increases, the uncertainty in a given measurement decreases, since $F_{clock}=1/T_{clock}$. A typical system clock speed is 50 Megahertz, which results in an uncertainty e of $\pm 10$ nanoseconds, as calculated from equation (3). The mean error e(t) is zero, since the ideal quantization error probability density function is symmetric. Also, the standard deviation is approximately $0.29*T_{clock}$, which is also the rms value of the uncertainty e(t). The rms value of e(t) can also be considered as a measure of signal noise due to digitization. For example, if the maximum period between zero-crossings is quantized using 256 quantizing increments, the peak signal-to-rms-noise ratio would be 0.4%, or about 48 db.

The actual number of quantizing increments, i.e., clock pulses that fit within a zero-crossing period is bounded by the deviation frequency (DF) bandwidth. The width of a zero-crossing period is simply the clock frequency divided by twice the quantity "IF frequency$\pm$the DF frequency". Thus, the maximum number of clock pulses in a digitized sample is given by:

$$N_{max}=[2T_{clock}(IF+DF_{min})]^{-1}. \qquad (4)$$

while the minimum number of clock pulses in a digitized sample is given by:

$$N_{min}=[2T_{clock}(IF+DF_{max})]^{-1}. \qquad (5)$$

To determine the resolution width after digitization, subtract equation (5) from equation (4) to obtain:

$$DN=F_{clock}*DF/(IF^2-DF^2). \qquad (6)$$

The actual count N is represented as a binary coded decimal (BCD) in the counter stage 70-76, and is transferred through the latches 80-82, and into the numerical processor 12, with "n-bit" resolution. The actual sample resolution n, valid to within the 1-bit error term e(t), is given by:

$$n=Log_{10}(DN)/Log_{10}(2)=3.32\ Log_{10}(DN) \qquad (7)$$

and the fullscale sinewave RMS signal to RMS noise ratio in Nyquist bandwidth is given by:

$$SNR=6.02\ n+1.76\ dB=Log_{10}(DN)+1.76\ dB. \qquad (8)$$

Count values provided to the numerical processor 12 are scaled and weighted, as explained below, to exploit the full n-bit range of the numerical processor. Next, one or more of the following processes is used: a "windowing" process for pulse averaging, using a Rectangular Window, or a Hamming Window, for example, and for providing data filtering and a preliminary treatment of digital quantization errors; and low-pass filtering, for limiting the data to a specific frequency band, and for removing noise, thereby improving the signal-to-noise ratio. Data thus processed by the numerical processor 12 is subsequently provided to a digital-to-analog converter (DAC).

Scaling and weighting of count values is governed by the equation:

$$A(i)=a*N(i)+b \qquad (9)$$

where a and b are scaling and weighting constants, respectively, N(i) represents the "i"th time-period count value between zero-crossings "i−1" and "i", and A(i) is the "i"th scaled and weighted count value. Given the incoming binary pulse-count data N(i) provided by the counters 22 and 24, the system implements equation (9) to provide complete demodulation of an FM IF signal, in the sense that a voltage proportional and commensurate with the "number" A(i) is output to the DAC.

The constants a and b, are found using the full-scale positive (FSP), and full-scale negative (FSN) DSP processor values. The FSP and FSN values are determined by the "full-range" n-bit value, e.g., 65,536 for 16 bits, such that FSP is equal to (Full-Range)/2-1, and FSN is equal to -(Full-Range)/2, expressed in a two's complement binary representation. As such, a and b are given by:

$$FSP=a*Nmin+b \qquad (10)$$

and $$FSN=a*Nmax+b, \qquad (11)$$

such that $$a=(FSP-FSN)/(Nmin-Nmax)$$

and $\qquad (12)$ $$b=FSP-[(FSP-FSN)/(Nmin-Nmax)]*Nmin. \qquad (13)$$

When simple pulse-averaging is used, a so-termed rectangular averaging window of width M slides over the scaled and weighted count values A(i), where M is the number of count values within the averaging window, and the M count values are averaged together to provide an average scaled and weighted count value A(j) over the last M count values. A value A(j) can be generated for each A(i) by advancing the window by one count value to A(i+1), or a value A(j) can be generated for every nth count value A(i+n) to reduce the data rate, thereby allowing more time for other operations. In a preferred embodiment, M=2 and n=2, so the window includes two count values and advances by two count values at a time, thereby halving the data rate. Other combinations of n and M can also be used. The average scaled and weighted count value A(j) is given by:

$$A(j)=(1/M)*SUM(A(i)), \qquad (9b)$$

where A(i) is given by equation (9), i=h, h−1, ... h−(M−1), and h is the index i of the current count value A(i).

Window functions such as the simple window averaging just described are used to pre-condition incoming data. Other typical window functions are, for example, of the Hamming or Von Hann type, that generally serve to deemphasize the effect of certain coefficients within a sliding window, while augment the effect of others within the window. The Hamming window coefficients $w_H(n)$ are of form:

$$w_H(m) = 0.54(1 - 0.8519 \cos(2 \text{ pi}^* m/(M-1))), \quad (14)$$

while the Von Hann window coefficients $w_v(n)$ are given by:

$$w_v(m) = 0.50(1 - \cos(2 \text{ pi}^* m/(M-1))), \quad (15)$$

with $m = 1, \ldots M$, and $M =$ the number of count values $A(x)$ in the window. For example, when $M=3$, $w_H(m) = [a, b, c]$, where a, b, and c are constants computed according to equation (14). The window can advance by one or more count values, and upon each advance, the inner product of the array $w_H(m)$ and the array of values within the window is computed to yield a scalar quantity. To reduce the data rate, the window can advance by more than one value each time it advances. The Hamming or Von Hann window function can be used in addition to, or in place of, the simple rectangular window averaging scheme discussed above.

Next, the method of the invention employs low-pass filtering to reduce inband noise, and smooth out residual quantization jitter. The filters used include, but are not limited to, direct form (DF), finite impulse response (FIR), and infinite impulse response (IIR) filter realizations. The direct form filter, for example, has the following form, $$A(x) = \sum_{k=1}^{J} a_k A(x-k) + \sum_{k=0}^{L} b_k N(x-k) \quad (16)$$

where, $A(x)$, the filter output, is the result of the recursion step where previous outputs, $A(x-k)$, are convolved with IIR coefficients $a_k$, and previous inputs are convolved with FIR coefficients $b_k$.

In the current embodiment, a low order (e.g. 5-10 zeros and poles) IIR Butterworth filter is applied to a signal template, in real time, just prior to signal output to the DAC stage. A Butterworth filtering technique was chosen due to its exceptionally flat passband response, and approaches a true "brick-wall" type filter in its digital realization.

Figure 3:
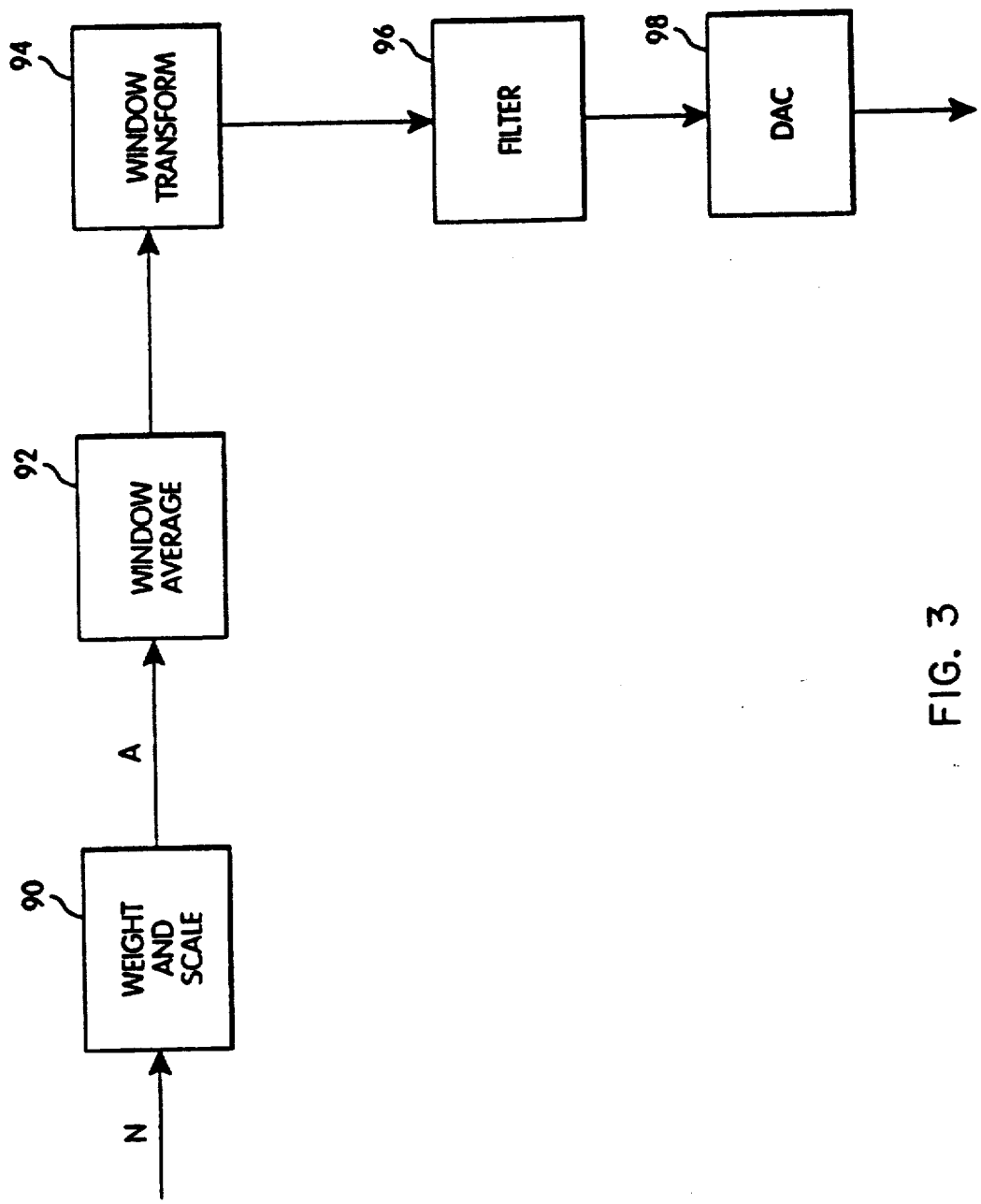
FIG. 3 is a flow diagram of a process implemented by the numerical processor of FIG. 1.

In summary, FIG. 3 illustrates the sequence of processes used to transform the sequence of count values provided by the discriminator 10 of FIG. 1 to the numerical processor 12. The values N are first weighted and scaled (90), and then are window averaged (92), thereby reducing the rate of data passed to subsequent calculations. In a preferred embodiment, a window transformation technique, such as a Hamming or Von Hann transformation (94), is then used. The data is then filtered (96) by a low-pass filter, just prior to being introduced to the DAC step (98).

It may be desirable to weight and scale the count values prior to filtering, and such weighting and scaling can be adequately performed using simple analog circuitry, as is well-known in the art.

The clock rate for measuring zero-crossing intervals is preferably a rate of generally at least 8 times the Nyquist rate of the highest audio frequencies encountered so as to minimize distortion.

The zero-crossing periods $T(t)$ of equation (1) are given within the limits of count sample quantization uncertainty, i.e., one clock period (e,g., about 100 nanoseconds), by equation (2).

To provide further improved performance in the presence of noise in the signal to be demodulated, a so-termed "bounds-checking" routine is used. In a demodulation apparatus of the invention, noise manifests itself as count anomalies. These count anomalies occur throughout the full range of count values, including "In-Band Noise", which falls within the range of $N_{min}$ to $N_{max}$.

To avoid problems introduced by this noise, the numerical processor implements the bounds-checking routine, which routine parses through incoming zero-crossing count data, and identifies data which falls outside of the range $N_{min}$ to $N_{max}$ by testing for data below $N_{min}$ and testing for data above $N_{max}$. Should a value fall outside of the range of $N_{min}$ to $N_{max}$, it is assigned a value at a corresponding extremum point, i.e., the FSN or FSP point. For example, the bounds-checking routine is shown in FIG. 3C as step 126, occurring after the step of period measurement 124. Steps 128-136 illustrate subsequent steps in a polynomial curve-fitting method, described below.

In the linear first order estimation of equation (9), digitized zero-crossing samples are input to the numerical processor, e.g., a digital signal processor (DSP), where they are subjected to "count scaling" to exploit the full n-bit range of the DSP. Equation (9), in conjunction with incoming binary count data, represents a complete signal demodulation estimation process.

Figure 4:
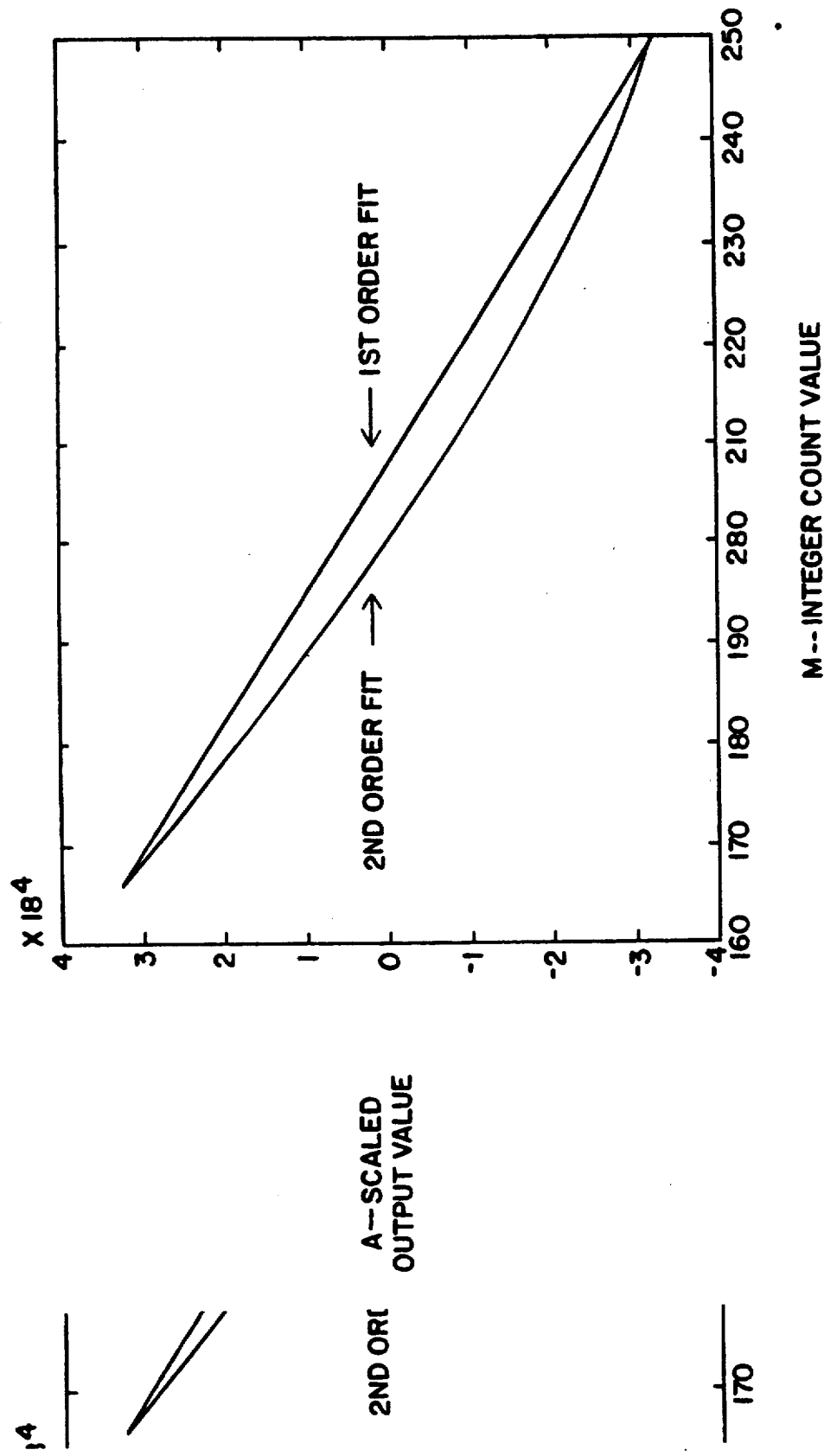
FIG. 4 is a plot of linear scaled and weighted count values versus the original count values, together with a plot of scaled and weighted count values augmented with a second-order nonlinear term versus the original count values.

FIG. 4 is a plot of equation (9), where $a = -780$ and $b = 162,240$, which are the parameters when $F_{clock} = 40$ Mhz, IF = 100 Khz, $DF_{max} = 20$ Khz, FSP $= -$FSN$=32760$, and thus $N_{max} = 250$ and $N_{min} = 166$. Also, at $N(i) = 208$, $A(i) = 0$, where $N(i) = 208$ is referred to as the "linear" IF.

Equation (9) is the equation of a straight line, and equation (1) is the equation of a reciprocal function. Over a very short region, a straight line can sufficiently model a curve. However, the range of numbers encompassed here is large, suggesting that a "linear fit" might perform well only at the endpoints of the range of the fit, i.e., between $N_{min}$ and $N_{max}$, and poorly in the middle of this range, i.e., at the linear IF. This can be tested by examining the fit at the value of $A(i)$ where $N(i)$ corresponds to 100 Khz, the IF. At the IF, DF=0, and since the width of a zero-crossing period is simply the clock frequency divided by twice the quantity "IF frequency + the DF frequency", N=200. However, in solving equation (9) with N=200, $A(i) = 6240$, which value of $A(i)$ represents an incorrect response with about 10% error. This error is introduced mostly due to estimation of the signal about the Linear IF value.

A polynomial curve-fitting method will now be discussed which directly addresses and solves the aforementioned problem of linear fit inconsistencies. This approach comes very close to the behavior associated with a function of the form given by equation (1).

The FSP Value, FSN Value, and an Intermediate Value are used to generate a second-order nonlinear equation with coefficients that make the nonlinear equation "closest" to the expression of equation (1) in a "Least Squares" sense. The coefficients for estimating data in the range $N_{min}$ to $N_{max}$ can be found using a least-squares-fit process, such as one employing the Vandermonde matrix, as can be found in the PC-MATHLAB User's Guide, by the MATHWORKS, October 1990. The polynomial solution is of form $$A(N) = c_0 + c_1 N + c_2 N^2, \quad (17)$$

where $c_0$, $c_1$, and $c_2$ are the zeroth, first, and second order coefficients respectively, and N is an incoming zero-crossing count value.

As an example, data from the previous section's example, with FSP=32760 ($N_{min}$=166), FSN=32760 ($N_{max}$=250), and Intermediate Value equal to zero (0), was used as input to the second order fitting routine. FIG. 4 shows the second order solution in the range of zero-crossing count values from 166 to 250, with the data curve corresponding to the linear equation overlaid as a reference. Thus, the difference between the linear and the nonlinear approaches is significant.

In FIG. 4 it is of particular interest to note that the curve marked "2nd Order Fit" not only ends perfectly at the count extrema, but also passes directly through the count midpoint, N(i), since this point was used to obtain the curve. Several other random points were evaluated off-line for accuracy, and were observed to fall within 1% of the expected values. In addition, the accuracy of the second-order estimation method was also borne out in real-time testing using a Total Harmonic Distortion (THD) analyzer.

Figure 5:
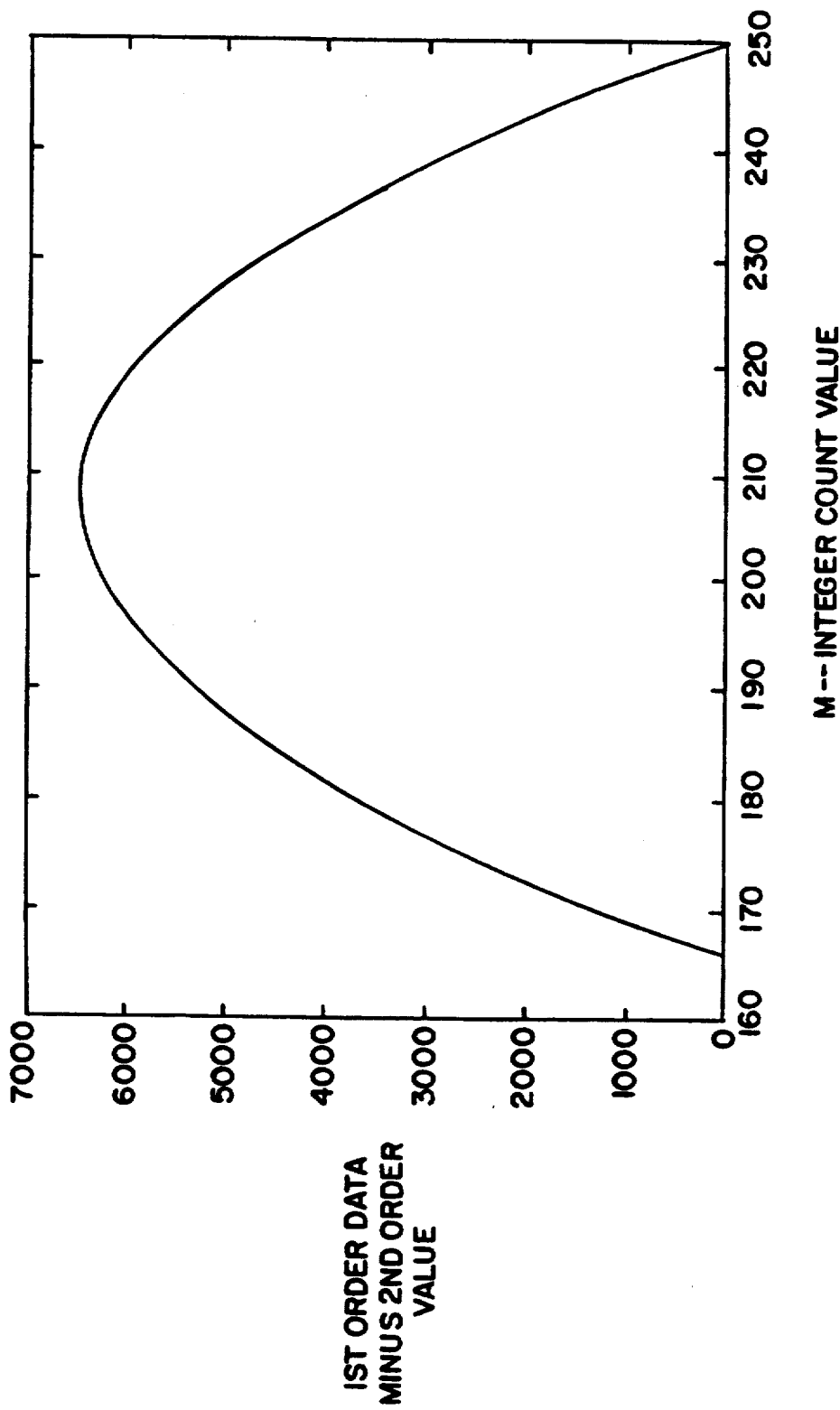
FIG. 5 is a plot of the difference of the linear scaled and weighted count values and the scaled and weighted count values augmented with a second-order nonlinear term, versus the original count values.

To validate the error associated with a linear fit to the data, a data set was generated which contains the difference between the linear and the second order fit. The results are shown in FIG. 5, wherein it can be determined that almost 75% of the estimated values from the linear fit will incur at least 5% error.

In another preferred embodiment, a so-termed "reciprocal fit count scaling" method is employed that provides better performance than the linear count scaling method, and improved performance with respect to the least-squares-fit nonlinear count scaling method. Such improved performance provides an estimated signal with significantly higher scaling accuracy, lower total harmonic distortion, and an excellent signal-to-noise ratio. In fact, the reciprocal count scaling method provides an exact analytic solution, and guarantees the most accurate and optimal results attainable from a system of this type.

Recall that the average instantaneous frequency F(t) of a sinusoidal temporally modulated signal can be represented by the reciprocal of twice the period T(t) measured between zero-crossings, where F(t)=1/(2*T(t)), as in equation (1).

The value of the average instantaneous frequency F(t) is bounded by the deviation frequency extrema $DF_{max}$ and $DF_{min}$, where $DF_{min}$ is equal to $-DF_{max}$. As previously stated, the number of counts N(t) within a period T(t) is directly proportional to the reciprocal of the product of the system clock period $T_{clock}$ with the instantaneous deviation frequency "IF+DF(t)". Thus, $$N(t) = [2T_{clock}(IF+DF(t))]^{-1}. \quad (18)$$

Therefore, the maximum possible number of clock counts within a period T(t) is given by $$N_{max} = [2T_{clock}(IF+DF_{min})]^{-1}. \quad (4)$$

Likewise, the minimum possible number of clock counts within a period T(t) is given by $$N_{min} = [2T_{clock}(IF+DF_{max})]^{-1}. \quad (5)$$

Count values N(t) are provided to the numerical processor 12 that scales and weights the count values N(t) according to a set of scaling and weighting coefficients to provide scaled and weighted values. To obtain the scaling and weighting coefficients, the numerical processor employs its full "n-bit" range, and may apply a linear fit method, a least squares fit method, or a reciprocal fit (RF) method.

The RF method of count-scaling is generally expressed by the equation $$A(i) = a/N(i) + b \quad (19)$$

In equation (19), the inverse slope parameter a and the y-intercept parameter b represent scaling and weighting coefficients. N(i) represents the "i"th time-period sample count value between zero-crossings "i−1" and "i", and A(i) represents the "i"th scaled and weighted count value, with maximum/minimum extrema of $\pm 2^{15}$.

Equation (19), in conjunction with the incoming binary count data and a precalculated knowledge of the count extrema, represents a complete signal demodulation method. One need only to calculate the values of a and b.

The parameters a and b are found using full-scale positive (FSP) and full-scale negative (FSN) numerical processor values. The FSP and FSN values of the numerical processor are determined by the "full-range" n-bit value, i.e., 65536 for 16 bits, where FSP is equal to "full range/2−1", and FSN is equal to "−full range/2". Thus, a and b are evaluated by $$FSP = a/Nmin + b \quad (20)$$

and $$FSN = a/Nmax + b \quad (21)$$ such that $$a = 2 \cdot [(N_{min} \cdot N_{max})/(N_{min} - N_{max})] \cdot FSP \quad (22)$$

and $$b = -[(N_{min} + N_{max})/(N_{min} - N_{max})] \cdot FSP \quad (23)$$

Using these expressions for a and b in equation (19), A(i) can be expressed as $$A(i) = [FSP/(N_{min} - N_{max})] \cdot \{(2 \cdot N_{min} \cdot N_{max}/N_i) - (N_{min} + N_{max})\}. \quad (24)$$

Figure 6:
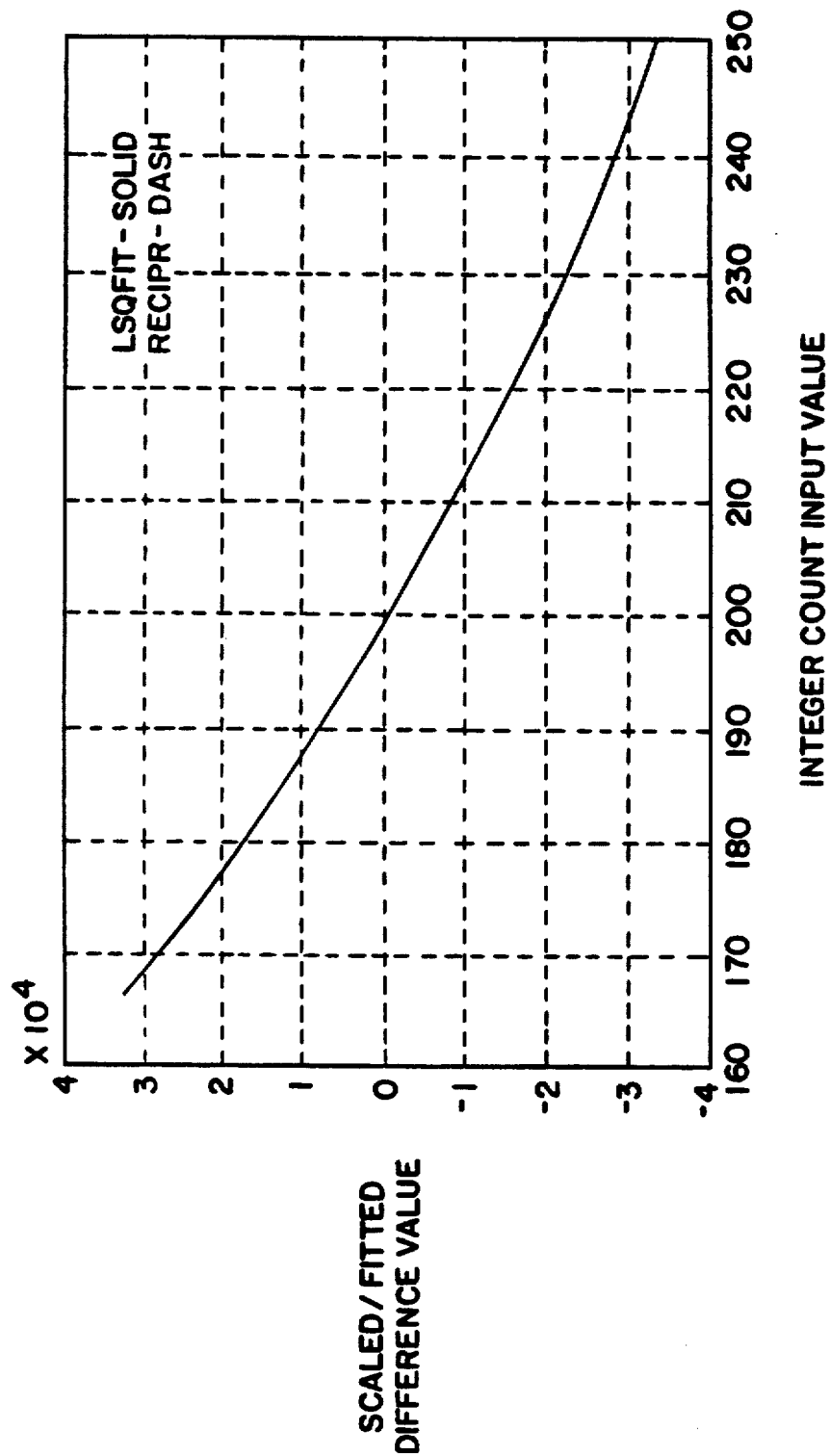
FIG. 6 is a plot of scaled and weighted count values augmented with a second-order nonlinear term versus the original count values, together with a plot of reciprocal fit count values versus the original count values.
Figure 7:
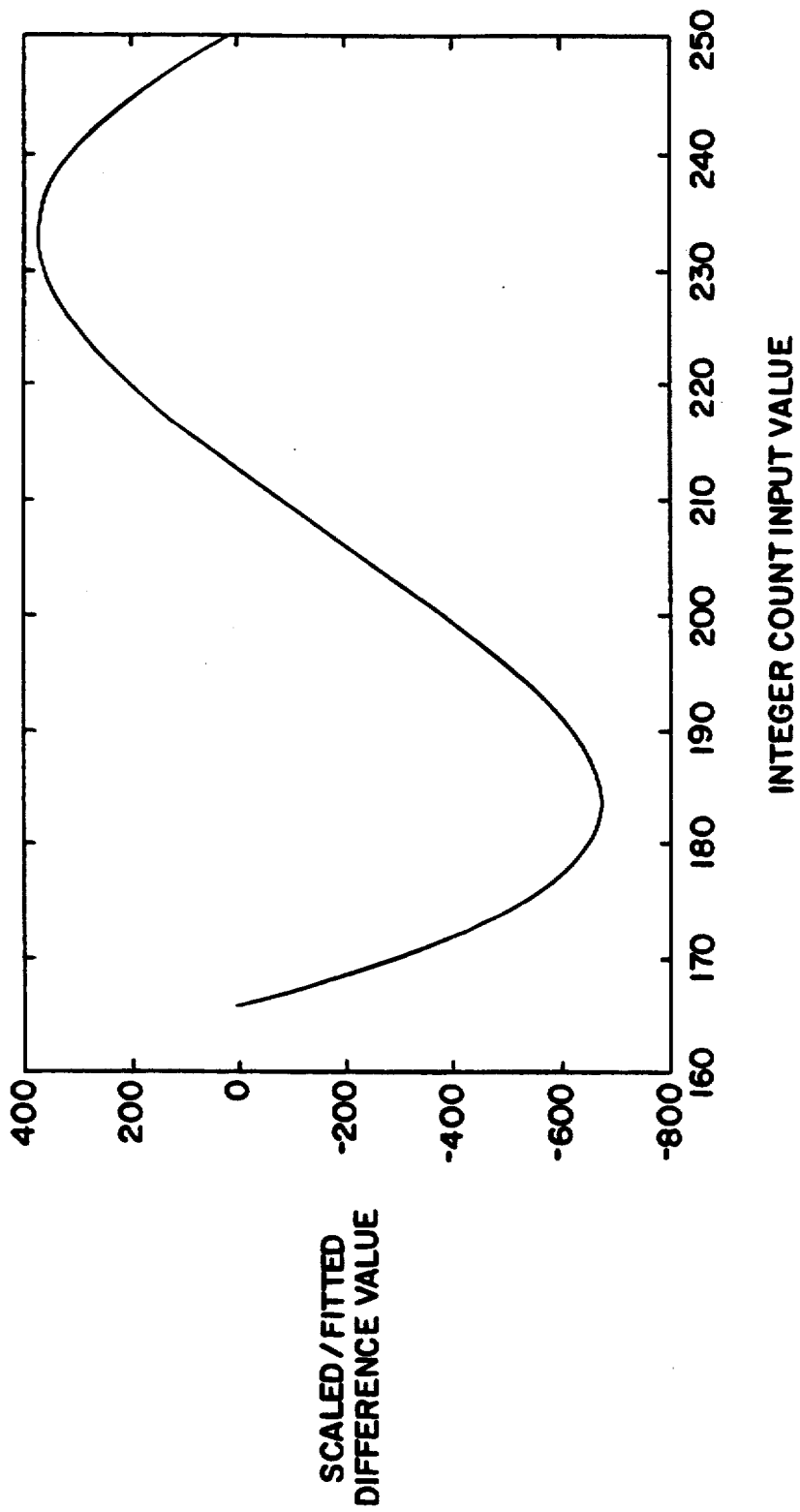
FIG. 7 is a plot of the difference of the scaled and weighted count values augmented with a second-order nonlinear term and the reciprocal fit count values, versus the original count values.

With reference to FIG. 6, a comparison of the reciprocal fit scaling method and the least squares fit nonlinear scaling method is provided by plotting a scaled and fitted output value versus the integer count input value for $F_{clock}$=10 Mhz, IF=25 Khz, $DF_{max}$=5 Khz, and FSP=−FSN=32760. $N_{max}$250, and $N_{min}$=166. From equations (22) and (23), a=390*83000, and b=390*416. By using these results in equation (24), the expression for A(i) in the case of the reciprocal fit is given by $$A(i) = 390 \cdot [(83000/N(i)) - 416], \quad (25)$$

As illustrated in FIG. 6, the least squares fit nonlinear scaling method provides a very high level of signal resolution, making the theoretically predicted difference between the least squares method and the exact reciprocal fit scaling method apparently inconsequential. In particular, the average theoretical error associated with the least squares approximation as compared to the reciprocal fit scaling method is 0.20%, i.e., 0.02 dB difference, while the maximum theoretical error associated with any given data point is just 1.0%, i.e., 0.1 dB difference. While these theoretical results might lead one's intuition to assume that the two methods are effectively equivalent, in practice, the reciprocal fit scaling method provides an improvement in signal-to-noise ratio of approximately 1 dB. Thus, since the reciprocal fit scaling method does not incur an implementation penalty, the optimal choice is the reciprocal fit scaling method.

Figure 3A:
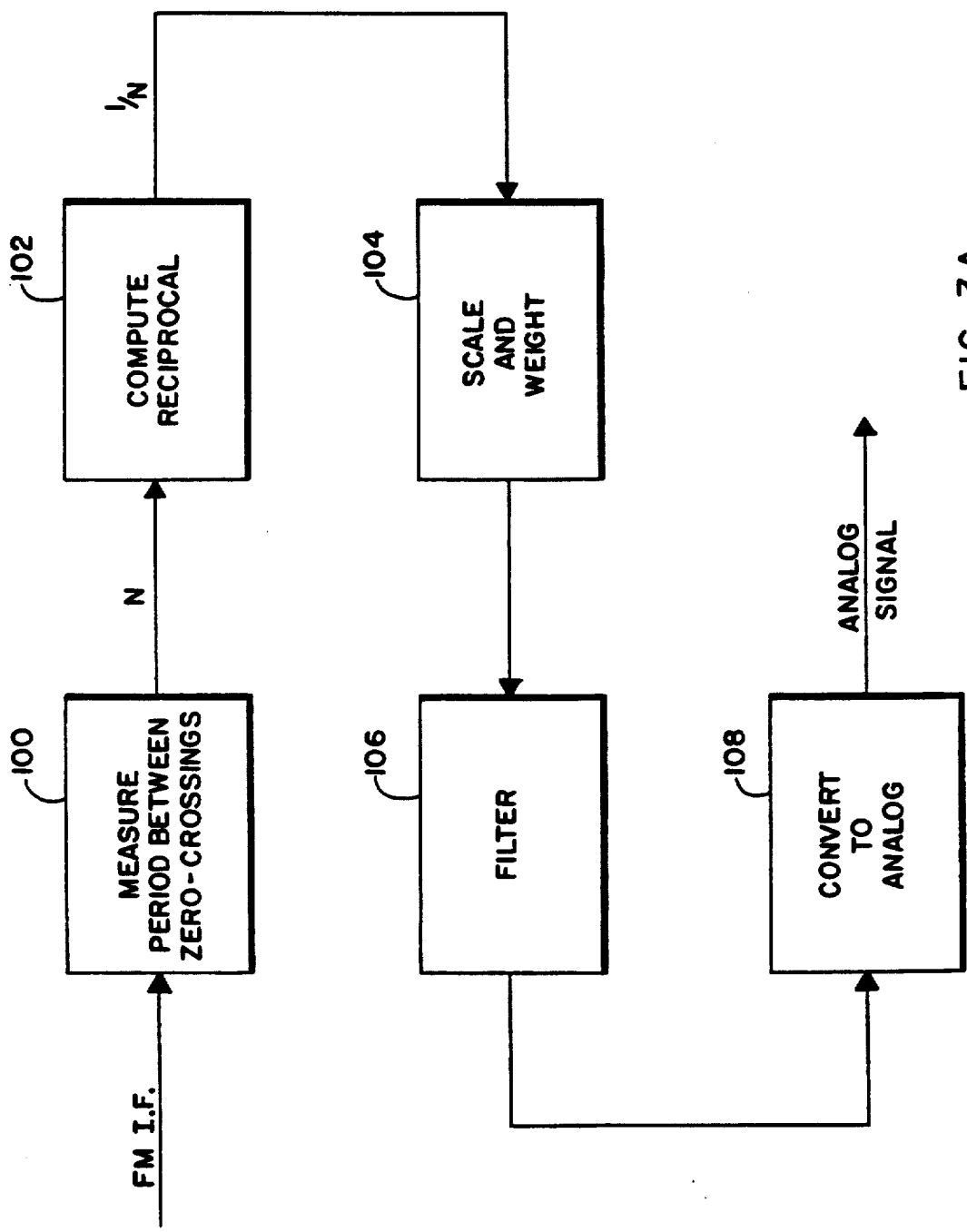
FIG. 3A is a flow diagram of a process that includes reciprocal fit count scaling.
Figure 3B:
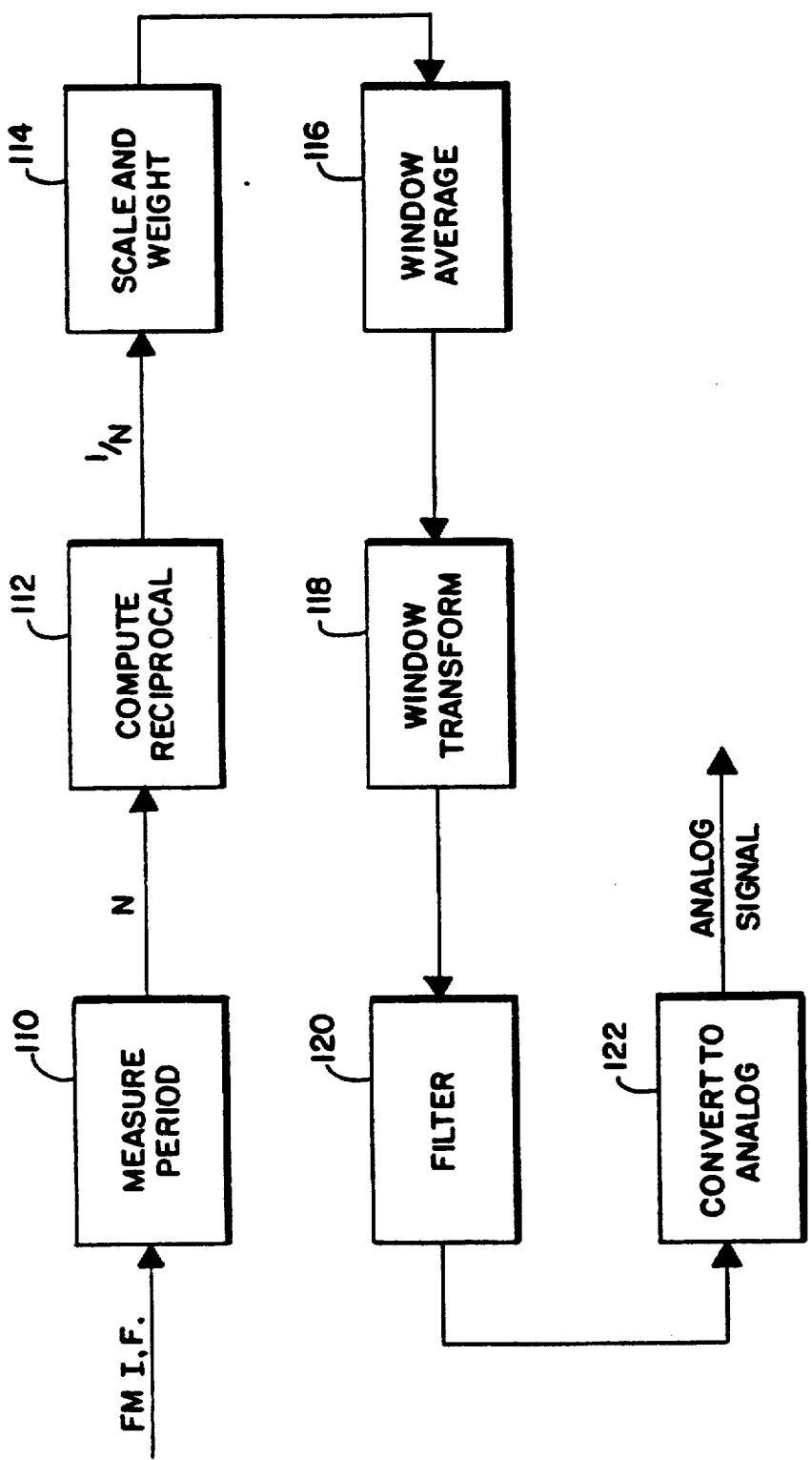
FIG. 3B is a flow diagram of a process that includes reciprocal fit count scaling and window functions.
Figure 3C:
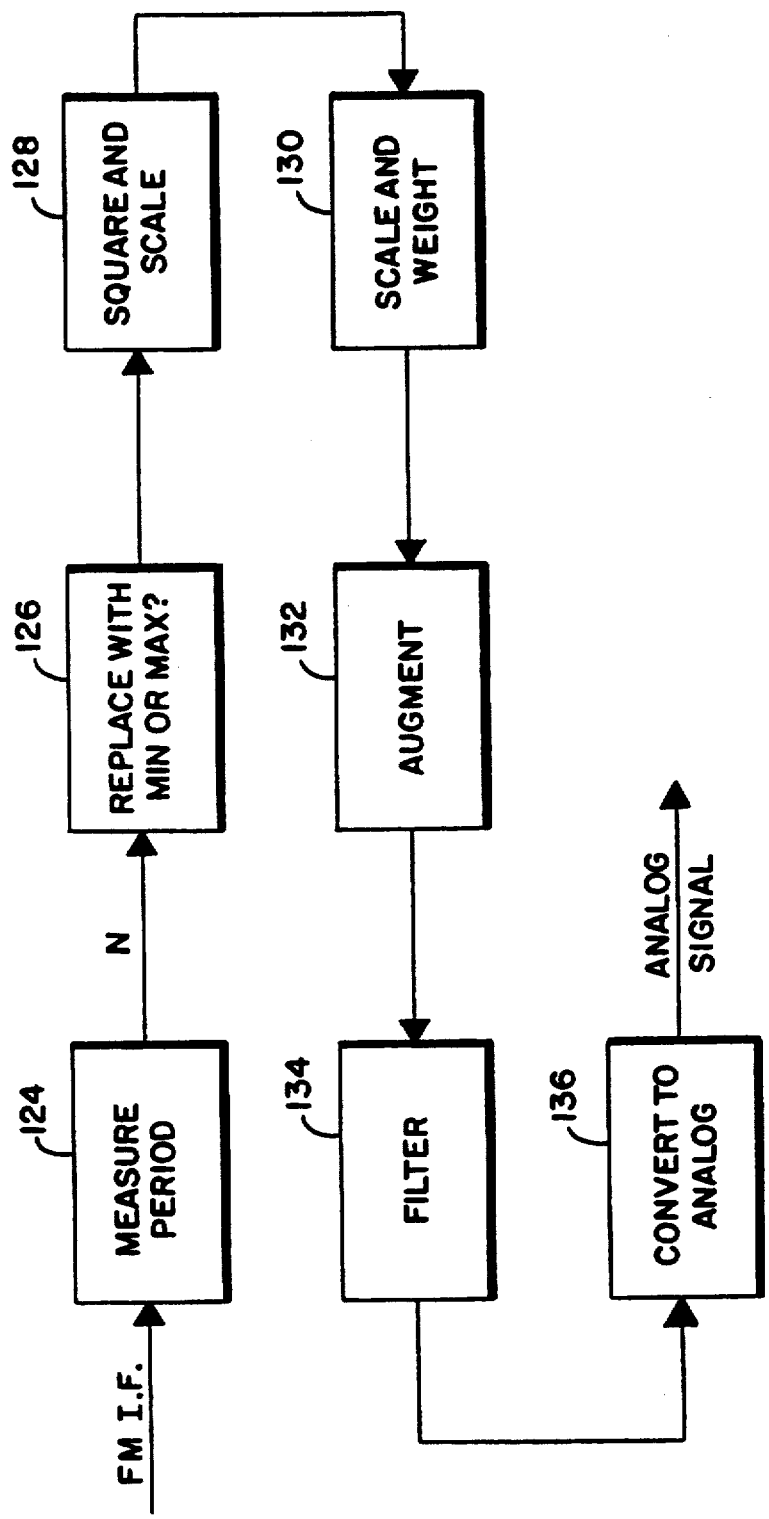
FIG. 3C is a flow diagram of a process that includes a bounds-checking routine and a second order fit.

FIGS. 3A and 3B show how the reciprocal fit steps 102 and 112, respectively, occur in two exemplary embodiments of the method of the invention. Steps 100, 104–108, 110, and 114–122 have been discussed above in the context of FIG. 3.

Other modifications and implementations will occur to those skilled in the art without departing from the spirit and the scope of the invention as claimed. Accordingly, the above description is not intended to limit the invention except as indicated in the following claims.

What is claimed is:

1. A digital demodulator for efficient demodulation of temporally modulated signals, the demodulator comprising:
   a zero-crossing event detector, responsive to a temporally modulated signal, that serves to detect zero-crossing events of said temporally modulated signal, and thereby provide zero-crossing event information;
   a period measurer, connected to said zero-crossing detector, that serves to receive said zero-crossing event information and measure the period between said zero-crossing events, thereby providing a sequence of period measurement values; and
   a signal processor, connected to said period measurer, that serves to convert said sequence of period measurement values into a demodulated signal.

2. The digital demodulator of claim 1,
   wherein said period measurer measures the period between said zero-crossing events at a resolution corresponding to a clock rate of generally at least 8 times the Nyquist rate of a maximum encountered frequency of said temporally modulated signal.

3. The digital demodulator of claim 1 wherein said signal processor includes:
   a digital-to-analog converter that receives said sequence of period measurement values and provides said demodulated signal.

4. The digital demodulator of claim 1 wherein said signal processor includes:
   a conversion element that receives and transforms said sequence of period measurement values into a transformed digital data stream with a higher signal-to-noise ratio than said sequence of period measurement values; and
   a digital-to-analog converter that receives said transformed digital data stream and provides said demodulated signal.

5. The digital demodulator of claim 1 wherein said signal processor includes:
   a digital-to-analog converter that receives said sequence of period measurement values and provides an analog version of said demodulated signal; and
   an analog filter that receives said analog version of said demodulated signal and removes noise from said analog version of said demodulated signal to provide a demodulated signal with a higher signal-to-noise ratio than said analog version of said demodulated signal.

6. A method for demodulating a temporally modulated signal, the method comprising the steps of:
   measuring the period between zero-crossings of an intermediate signal of a modulated signal to provide a sequence of period values; and
   transforming said sequence of period values to provide a demodulated signal.

7. The method of claim 6 wherein the step of transforming includes the steps of:
   filtering said sequence of period values to provide a sequence of filtered values; and
   converting said sequence of filtered values into an analog signal.

8. The method of claim 6 wherein the step of transforming includes the steps of:
   converting said sequence of period values into an analog signal; and
   filtering said analog signal to provide a demodulated signal with a higher signal-to-noise ratio than said analog signal.

9. The method of claim 6 wherein the step of transforming includes the step of:
   for each period value that exceeds a maximum period value, replacing said period value with said maximum period value, and for each period value that does not exceed a minimum period value, replacing said period value with said minimum period value.

10. A method for demodulating a temporally modulated signal, the method comprising the steps of:
    measuring the period between zero-crossings of an intermediate signal of a modulated signal to provide a sequence of period values;
    obtaining a sequence of reciprocal values by computing the reciprocal of each period value in said sequence of period values;
    scaling and weighting each reciprocal value of said sequence of reciprocal values to provide a sequence of scaled and weighted reciprocal values;
    filtering said sequence of scaled and weighted reciprocal values to provide a sequence of filtered values; and
    converting said sequence of filtered values into an analog signal.

11. A method for demodulating a temporally modulated signal, the method comprising the steps of:
    measuring the period between zero-crossings of an intermediate signal of a modulated signal to provide a sequence of period values;
    obtaining a sequence of reciprocal values by computing the reciprocal of each period value in said sequence of period values;
    scaling and weighting said sequence of reciprocal values to provide a sequence of scaled and weighted reciprocal values;
    averaging the scaled and weighted reciprocal values within a sliding window to provide a sequence of window averaged values;

executing a Von Hann window function upon the sequence of window averaged values to provide a sequence of Von Hann values;
filtering said sequence of Von Hann values to provide a sequence of filtered values; and
converting said sequence of filtered values into an analog signal.

12. A method for demodulating a temporally modulated signal, the method comprising the steps of:
measuring the period between zero-crossings of an intermediate signal of a modulated signal to provide a sequence of period values;
obtaining a sequence of reciprocal values by computing the reciprocal of each period value in said sequence of period values;
scaling and weighting said sequence of reciprocal values to provide a sequence of scaled and weighted reciprocal values;
averaging the scaled and weighted reciprocal values within a sliding window to provide a sequence of window averaged values;
executing a Hamming window function upon the sequence of window averaged values to provide a sequence of Hamming values;
filtering said sequence of Hamming values to provide a sequence of filtered values; and
converting said sequence of filtered values into an analog signal.

13. A method for demodulating a temporally modulated signal, the method comprising the steps of:
measuring the period between zero-crossings of an intermediate signal of a modulated signal to provide a sequence of period values;
squaring and scaling each period value of said sequence of period values to provide a sequence of squared and scaled values;
scaling and weighting said sequence of period values to provide a sequence of scaled and weighted values;
augmenting said sequence of scaled and weighted values by adding a squared and scaled value to each corresponding scaled and weighted value to provide a sequence of augmented values;
filtering said sequence of augmented values to provide a sequence of filtered values; and
converting said sequence of filtered values into an analog signal.

14. The method of claim 10, 11, 12, or 13 further including the step of:
after the step of measuring the periods between zero-crossings, for each period value that exceeds a maximum period value, replacing said period value with said maximum period value, and for each period value that does not exceed a minimum period value, replacing said period value with said minimum period value.

* * * * *

UNITED STATES PATENT AND TRADEMARK OFFICE
CERTIFICATE OF CORRECTION

PATENT NO. : 5,239,273
DATED : August 24, 1993
INVENTOR(S) : Mark D. Hedstrom, et al It is certified that error appears in the above-indentified patent and that said Letters Patent is hereby corrected as shown below:

Column 4, line 38, "Of Clock" should read --of clock--.

Column 9, line 15, "(15)" which is the equation number, appears as part of the equation, it should be deleted and moved to the far right in line with the "(14)" equation number above it Column 12, line 60, "$N_{max}250$" should read --$N_{max} = 250$--.

Signed and Sealed this

Twelfth Day of July, 1994

Attest:

BRUCE LEHMAN

*Attesting Officer*   *Commissioner of Patents and Trademarks*